United States Patent [19]

Stein

[11] 4,290,187

[45] Sep. 22, 1981

[54] METHOD OF MAKING CHARGE-COUPLED ARRANGEMENT IN THE TWO-PHASE TECHNIQUE

[75] Inventor: Karl-Ulrich Stein, Munich, Fed. Rep. of Germany

[73] Assignee: Siemens Aktiengesellschaft, Berlin & Munich, Fed. Rep. of Germany

[21] Appl. No.: 60,376

[22] Filed: Jul. 25, 1979

Related U.S. Application Data

[60] Continuation of Ser. No. 863,526, Dec. 22, 1977, abandoned, which is a division of Ser. No. 696,745, Jun. 16, 1976, abandoned, which is a continuation of Ser. No. 513,350, Oct. 9, 1974.

[30] Foreign Application Priority Data

Oct. 12, 1973 [DE] Fed. Rep. of Germany ....... 2351393
Oct. 9, 1974 [DE] Fed. Rep. of Germany ......... 513350

[51] Int. Cl.$^3$ ..................... H01L 13/00; H01L 27/10
[52] U.S. Cl. .................................. 29/576 B; 29/578; 29/591; 148/1.5; 357/24
[58] Field of Search ............. 29/578, 589, 591, 576 B; 357/24, 91; 148/1.5

[56] References Cited

U.S. PATENT DOCUMENTS 3,852,799 12/1974 Walden ................................ 357/24

Primary Examiner—Upendra Roy
Attorney, Agent, or Firm—Hill, Van Santen, Steadman, Chiara & Simpson

[57] ABSTRACT

A charge-coupled arrangement in the two-phase technique in accordance with the charge-coupled-device principle in which an electrically insulating layer is applied to a substrate of semi-conductor material, with such electrodes arranged in spaced relation on such layer, a second electrically insulating layer disposed on the electrodes and additional electrodes being disposed on the second insulating layer, in which such additional electrodes extend into spaces separating adjacent electrodes applied to the substrate, with the zone of the substrate beneath such further electrodes being more highly doped than the substrate. The electrodes may comprise aluminum silicon, molybdenum, chromium or tungsten, while the second insulating layer may comprise $SiO_2$ or $Al_2O_3$.

1 Claim, 2 Drawing Figures

METHOD OF MAKING CHARGE-COUPLED ARRANGEMENT IN THE TWO-PHASE TECHNIQUE

This is a continuation, of application Ser. No. 863,526, filed Dec. 22, 1977, now abandoned, which is a division of application Ser. No. 696,745 filed June 16, 1976, now abandoned, which is a continuation of application Ser. No. 513,350 filed Oct. 9, 1974.

BACKGROUND OF THE INVENTION

The invention is directed to a charge-coupled arrangement in the two-phase technique in accordance with the charge-coupled-device principle in which an electrically insulating layer is applied to a substrate of semi-conductor material and electrodes provided in spaced relation thereon, followed by a second electrically insulating layer applied to the electrodes, with further electrodes being provided which extend into spaces separating the first mentioned electrodes and in which the substrate beneath such further electrodes is more highly doped than the substrate.

Charge-coupled arrangements of this type are known, for example, from the publication Solid State Circuits Conference 72, Record NEREM, pages 157–160, in which is described a charge-coupled arrangement of this type. The transferrable quantity of charge of such an arrangement, however, is limited, by the different start or threshold voltages in the various gate zones to a relatively small value.

BRIEF SUMMARY OF THE INVENTION

The invention therefore has among its objects the provision of a charge-coupled arrangement in two-phase technique in which the surface potential is adjustable and which is achieved by the use of the combination of electrodes and doping above referred to.

An important advantage of a charge-coupled arrangement in accordance with the invention resides in fact that without the employment of additional masking steps which, because of the additionally required adjustment intervals, would increase the space requirements, it is possible to achieve a well definable increase in the transferrable quantity of charge, without a simultaneous impairment of the transmission properties.

Advantageously the process steps employed for this purpose may be readily interposed into known process sequences, for example such as employed in the silicon-aluminum-gate technique.

BRIEF DESCRIPTION OF THE DRAWINGS

In the drawings wherein like reference characters indicate like or corresponding parts.

DETAILED DESCRIPTION OF THE INVENTION

Figure 1:
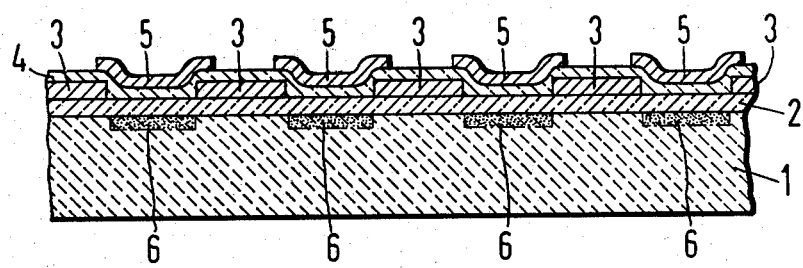
FIG. 1 schematically illustrates a section through a charge-coupled arrangement in accordance with the present invention.

Referring to FIG. 1, the reference numeral 1 indicates generally a substrate of semiconductor material, preferably n-doped or p-doped silicon, which is provided with a layer 2 of $SiO_2$. Electrodes 3, formed from aluminum, tungsten, chromium, molybdenum or silicon, and which comprise the electrodes of the first plane, are disposed in spaced relation on the electrically insulating layer of $SiO_2$. The electrodes 3 as well as the areas of the layer 2 which are not overlayed by the electrodes 3 are covered by a second electrically insulating layer 4, preferably consisting of $SiO_2$ or $Al_2O_3$. Positioned above the spacing gaps between the electrodes 3 of the first plane are disposed further electrodes 5, preferably formed from aluminum, tungsten, chromium, molybdenum or silicon, which comprise the electrodes of the second plane.

In accordance with the present invention the substrate 1 is provided with doped zones 6 positioned beneath the electrodes of the second plane. In this case, the zones 6 are more highly doped than the substrate 1 composed of semiconductor material. Such doped zones 6 result in an increase in the quantity of charge which may be transferred between the electrodes 3, and thus may provide an adjustment for the quantity of charge which may be transferred.

Figure 2:
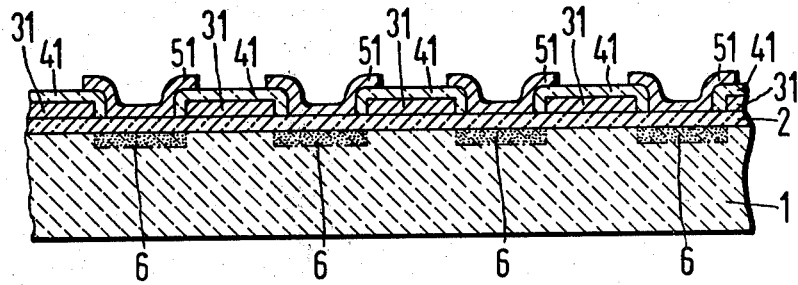
FIG. 2 is a similar section to a charge-coupled arrangement of slightly modified construction.

FIG. 2 illustrates a charge-coupled arrangement in accordance with the invention which is generally similar to that illustrated in FIG. 1, with the exception that the second electrically insulating layer 41 is applied merely to the electrodes 31, whereby the further electrodes 51, as will be apparent from the figure, are disposed within the space gaps between the electrodes 31 and thus likewise are at least partially disposed on the first electrically insulating layer 2. The electrodes 31 preferably are composed of aluminum and the second insulating layer 41 of $Al_2O_3$. This insulating layer preferably is produced by anodic oxidation of the electrodes 31. The following described method may be employed, for example, for the doping of the zones 6.

If the electrodes 3 and 31 are composed of a high-temperature-resistant material, the doping of the zones 6 can be effected by the employment of conventional solid body diffusion at temperatures of around 1000° C. The source of the doping atoms preferably can be a gas, a doped silicon layer or a doped oxide. The doping is effected following the application of the electrodes 3 and 31 to the first insulating layer 2, and prior to the application of the second insulating layer on the electrodes 3 and exposed zones of the layer 2. Advantageously the electrodes 3, and 31 may be employed as a masking structure in the doping operation.

The zones 6 can, for example, also be doped by the employment of ion implantation, which method advantageously can be employed even when the electrodes 3 are formed from a material which is not high-temperature-resistant. In the case of ion implantation, the electrodes 3 again may be employed as a mask for the implantation operation. The ion implantation thus again is advantageously effected following the application of the electrodes 3 to the layer 2, and prior to the application of the layer 4 to the electrodes 3 and exposed zones of the layer 2.

The zones 6 of an n-conducting silicon substrate are doped with suitable donor atoms while the zones 6 of p-conducting silicon substrate are doped with acceptor items. The implantation dose of $2.10^{12}$ cm$^{-2}$ is, for example, implanted into a p-conducting silicon substrate with $N=5.10^{14}$ 1/cm$^3$ boron ions.

Having thus described my invention it will be obvious that although various minor modifications might be suggested by those versed in the art, it should be understood that I wish to embody within the scope of the patent granted hereon all such modifications as reason- ably, and properly come within the scope of my contribution to the art.

I claim as my invention:

1. A method of producing a charge-coupled arrangement in two-phase technique, comprising two series of cooperable spaced electrodes with the spaced electrodes of one series overlying spaces between the electrodes of the other series, said method comprising the steps of applying a layer of insulating material to a substrate of semiconductor material, applying to said insulating layer a plurality of electrodes comprising one of said series and disposed in spaced sequential relation on such layer, utilizing said electrodes as masking members and introducing doping atoms by means of ion implantation into said semiconductor material between said electrodes, whereby said semiconductor material is provided with more highly doped zones of a same conductivity type as the substrate spanning the space gaps between such series of electrodes, applying, at least to said electrodes, a second layer of insulating material, and applying to the structure so formed further electrodes, comprising the other of said series, with the latter electrodes extending into said space gaps between the electrodes of said first series, in complete insulated relation with respect thereto, and overlying said more highly doped zones in insulated relation with respect to said zones.

* * * * *